United States Patent [19]
Fujimura et al.

[11] Patent Number: 6,007,671
[45] Date of Patent: *Dec. 28, 1999

[54] METHOD FOR HYDROGEN PLASMA DOWN-FLOW PROCESSING AND APPARATUS THEREOF

[75] Inventors: Shuzo Fujimura; Jun Kikuchi, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/699,933

[22] Filed: Aug. 20, 1996

Related U.S. Application Data

[63] Continuation of application No. 08/244,609, filed as application No. PCT/JP93/01560, Oct. 28, 1993.

[30] Foreign Application Priority Data

Oct. 28, 1992 [JP] Japan ..................................... 4-290362

[51] Int. Cl.$^6$ ...................................................... H05H 1/00
[52] U.S. Cl. .............................................................. 156/345
[58] Field of Search ............................... 156/345; 134/1, 134/1.1, 1.2, 1.3; 216/69; 438/727, 906, 723; 204/298.38; 118/723 ME

[56] References Cited

U.S. PATENT DOCUMENTS

| | | | |
|---|---|---|---|
| 4,983,254 | 1/1991 | Fujimura et al. | 150/345 X |
| 4,987,284 | 1/1991 | Fujimura et al. | 156/345 X |
| 5,000,819 | 3/1991 | Pedder et al. | 156/643 |
| 5,089,441 | 2/1992 | Moslehi | 438/716 X |
| 5,211,796 | 5/1993 | Hansen | 156/345 |
| 5,306,671 | 4/1994 | Ogawa et al. | 156/643 X |

FOREIGN PATENT DOCUMENTS

| | | |
|---|---|---|
| 1-112734 | 5/1989 | Japan . |
| 4-242920 | 8/1992 | Japan . |
| 5-136110 | 6/1993 | Japan . |

OTHER PUBLICATIONS

Anthony et al., "In situ cleaning of silicon subsrate surfaces by remote plasma-excited hydrogen," *J. Vac. Sci. Technol. B*, vol. 7, No. 4, Jul./Aug. 1989, pp. 621–626.

Fujimura et al., "Ashing of Ion-Implanted Resist Layer," *Japanese Journal of Applied Physics*, vol. 28, No. 10, Oct. 1989, pp. 2130–2136.

Higashi et al., "Ideal hydrogen termination of the Si(111) surface," *Appl. Phys. Lett.*, vol. 56, No. 7, Feb. 12, 1990, pp. 656–658.

Takahagi et al., "Control of the chemical reactivity of a silicon single-crystal surface using the chemical modification technique," *J. Appl. Phys.*, vol. 68, No. 5, Sep. 1, 1990, pp. 2187–2191.

Kishimoto et al., "In situ RHEED Monitoring of Hydrogen Plasma Cleaning on Semiconductor Surfaces," *Japanese Journal of Applied Physics*, vol. 29, No. 10, Oct. 1990, pp. 2273–2276.

Cho et al., "Surface electronic states of low-temperature H-plasma cleaned Si(100)," *Appl. Phys. Lett.*, vol. 59, No. 16, Oct. 14, 1991, pp. 1995–1997.

*Primary Examiner*—Thi Dang
*Attorney, Agent, or Firm*—Staas & Halsey LLP

[57] ABSTRACT

The present invention relates to a hydrogen plasma down-flow processing method and a hydrogen plasma down-flow processing apparatus and has an object to provide a hydrogen plasma down-flow processing method and a hydrogen plasma down-flow processing apparatus ensuring that it is possible to make it difficult for hydrogen atoms to deposit and recombine on the internal wall of the apparatus. High speed hydrogen plasma processing can be realized by improving transfer efficiency of hydrogen atoms to the processing chamber. Moreover hydrogen plasma efficiency can also be improved by reducing influence of oxidation species such as OH radical and oxygen atom concentrations can be controlled as desired by keeping the change in hydrogen atom concentration small. The apparatus includes a vacuum chamber of which at least a part of the structural members exposed to a vacuum is made by silicon oxide. In a hydrogen plasma down-flow processing method, whereby the processed object is processed in the down-flow area, the plasma is generated from the gas including at least hydrogen. A processing object is processed by heating at least a part of the silicon oxide region to 443° C. or higher.

40 Claims, 13 Drawing Sheets

METHOD FOR HYDROGEN PLASMA DOWN-FLOW PROCESSING AND APPARATUS THEREOF

This application is a continuation, of application Ser. No. 08/244,609, filed Jun. 6, 1994, now abandoned, which is a 371 of PCT/JP93/01560 filed on Oct. 28, 1993.

FIELD OF THE INVENTION

The present invention relates to a hydrogen plasma down-flow processing method and a hydrogen plasma down-flow processing apparatus and, in more detail, to a hydrogen plasma down-flow processing method and a hydrogen plasma down-flow processing apparatus which can be adapted for removal of a native oxide film or a resist film on a semiconductor surface particularly for enabling alleviation of crystal defects resulting from hydrogen plasma processing, processing under a low temperature, and high speed processing by improving transfer efficiency of hydrogen atoms to the processing chamber.

BACKGROUND OF THE INVENTION

In recent years, for example, in a semiconductor device manufacturing process, it has been reported that a native oxide film on a semiconductor surface results in a variety of defects and therefore it has also been discussed how to realize desirable semiconductor surface by removing the native oxide film.

Moreover, also in the semiconductor device manufacturing process, particular attention has been paid in these several years to the processing for a semiconductor surface utilizing hydrogen atoms, because only hydrogen is assumed as a substantial reducing gas which may be used for the semiconductor device manufacturing process. Especially high efficiency of hydrogen plasma has been confirmed for stripping of a resist used as a mask during ion implantation (S. FUJIMURA, J. KONNO, K. HIKAZUTANI AND H. YANO, JPN. J. APPL. PHYS., 28,2130, 1989) and for elimination of a native oxide film on the surface of a semiconductor device (A. KISHIMOTO, I. SUEMUNE, K. HAMAOKA, T. KOUJI, Y. HONDA AND M. YAMANISHI, JPN, J. APPL. PHYS., 29, 2273, 1990). In this manner, the contribution of hydrogen atoms, for example, is considered essentially in the process for removing a native oxide film on the surface of a semiconductor device. However, such elimination process is carried out mostly in the hydrogen plasma, providing a fear of generating damages.

It is considered to be a result that hydrogen atoms are easily recombinated and immediately return to hydrogen molecules. Therefore, it has long been desired to develop the technique for leading a large amount of hydrogen atoms to the area wherein influence of high energy particles of plasma can be neglected.

As a method of removing a native oxide film, some methods, such as realization of etching of a native oxide film of silicon by a reduced fluoric acid and termination of hydrogen (for example, G. S. HIGASHI ET AL., JPN. J. APPL. PHYS, LETT., 56, 656, 1990) and removal of a native oxide film of silicon or gallium-arsenic by hydrogen plasma (for example, A. KISHIMOTO ET AL., J. APPL. PHYS., 29, 2273, 1990) are well known. Moreover, it has also been reported that a native oxide film on the surface of a semiconductor device can be removed by hydrogen atoms (hydrogen radical) (T. TAKAHAGI ET AL., J. APPL. PHYS., 68, 2187, 1990), (B. Anthony ET AL., J. Vac. Sci. Technol. B7(4), July/August. 1989), (J. Cho ET AL., Appl. Phys. Lett. 59(16), Oct. 14, 1991). In addition, as a typical method which has long been used, hydrogen annealing under the temperature as high as approximately 100° C. has been known.

The existing high temperature hydrogen annealing described above is the most typical method of the prior art, but this method gives rise to difficulties in microminiaturization because it is impossible, for example, to ignore changes of profile of a diffused layer during the annealing. It becomes more distinctive as the microminiaturization progresses.

Moreover, in the existing processing by reduced fluoric acid described above, a stable surface can be obtained, for example, for the plane (111) of silicon, but the stable surface cannot be ensured for the plane (100) and the wet processing makes it difficult to make the connection with processing apparatuses in the successive stages (such as CVD, epitaxial and sputter or the like). Moreover, there arises a problem that fluorine is left at the surface even after the completion of the process.

Next, the hydrogen plasma processing of the prior art explained previously can advantageously overcome the problems described above but still has a problem that high energy particles represented by ions or electrons collide with the surface of semiconductor device resulting in damage. If power is lowered in order to eliminate damage, the processing rate is extremely lowered. This method is not practical because the processing takes too much time in the references listed above.

To prevent the processing rate from lowering, a method in which a small amount of water vapor is added to hydrogen plasma has been proposed. The method is useful for increasing hydrogen atom concentration in the plasma and controlling recombination of hydrogen atoms in the down-flow (Kikuchi, Fujimura, Suzuki, Yano: Fall Meeting of 39th Japanese Applied Physics Association; 29A-ZS-7). FIG. 12 illustrates an example of a conventional down-flow processing apparatus for which the water vapor is added to hydrogen. In FIG. 12, the numerals designate as follows: a quartz (quartz glass is more accurate but it is called only quartz for simplicity) tube 41, a microwave cavity 43 to which microwaves are applied from a microwave power supply 42, and an ESR cavity 44 coupled with an ESR apparatus 45.

However, in the conventional method where water vapor is added to hydrogen plasma, not only hydrogen atoms but also oxidation species such as OH radicals or oxygen atoms are generated though they are a small amount. Particularly, the OH radicals among these elements have an extensive oxidation power and is therefore considered as a factor which impedes the reducing effect of hydrogen atoms.

Moreover, as a method of the prior art for solving the problem that a rate of processing utilizing hydrogen plasma is low, a method in which water vapor and moreover oxygen are added to hydrogen gas, and it is also reported that this method realizes high concentration of hydrogen atoms within the down-flow owing to an increase of the dissociation coefficient of hydrogen molecules in the plasma and the control of recombination of hydrogen atoms in the down-flow (for example, Kikuchi, Fujimura, Suzuki, Yano: Fall Meeting of 39th Japanese Applied Physics Association; 29A-ZS-7).

However, since water vapor and oxygen gas were added to the hydrogen plasma under the condition that the flow rate thereof was fixed in this method, oxygen gas and OH radical were also generated simultaneously in addition to hydrogen atoms. In this case, the rate of adding both water vapor and oxygen gas to the hydrogen gas, and the concentration of oxygen gas and OH radicals are determined uniquely for the maximum concentration of the hydrogen atoms, which restricts freedom of process design. Moreover, the papers by Anthony et al. and Cho et al. mentioned above describe the fact that damages on the Si surface could be eased by removing a native oxide film by hydrogen atoms in the down-flow, but also suggested it would be better to make the residual moisture content as low as possible and also the concentration of hydrogen atoms at the Si surface lower. Therefore, it is difficult to expect remarkable improvement in an efficiency of removing the native oxide film by hydrogen atoms.

SUMMARY OF THE INVENTION

It is therefore an object of the present invention to provide a hydrogen plasma down-flow processing method and a hydrogen plasma down-flow processing apparatus wherein it can be difficult for hydrogen atoms to recombine with each other due to deposition thereof on the internal wall of the apparatus, which can realize high speed hydrogen plasma processing by improving transfer efficiency of hydrogen atoms to the processing chamber, improve hydrogen plasma processing efficiency by reducing influences of oxidation species such as OH radical, and properly control concentration of oxygen atoms and OH radicals while making the change of concentration of hydrogen atoms small.

In view of attaining the object mentioned above, the hydrogen plasma down-flow processing method of the present invention comprises a step for processing an object to be processed by heating the essential portion of a silicon oxide region of an apparatus up to 400° C. or higher, the apparatus having a vacuum chamber whose at least the principal portion of the structural members to be exposed to the vacuum condition is composed of silicon oxide, and thereby the processing object is processed on the down-flow side of the plasma.

In view of attaining the object mentioned above, the hydrogen plasma down-flow processing apparatus of the present invention comprises a temperature control means for setting, in the step of processing the object to be processed, the essential portion of the silicon oxide region of the apparatus to be 400° C. or higher in the hydrogen plasma down-flow processing apparatus for forming at least the principal portion of the structural members of a vacuum chamber to be exposed to the vacuum condition with silicon oxide, converting the gas including hydrogen to plasma and processing the object to be processed in the down-flow area of plasma.

In view of attaining the object mentioned above, the hydrogen plasma down-flow processing method of the present invention comprises a step for processing the object to be processed by setting at least the principal portion of the silicon oxide region to the temperature lower than the object to be processed in a hydrogen plasma down-flow processing method in which the gas including hydrogen is converted to plasma utilizing an apparatus forming at least the principal portion of the structural members of a vacuum chamber to be exposed to the vacuum condition with silicon oxide and thereby the processing object is processed in the down-flow side of the plasma.

In view of attaining the object mentioned above, the hydrogen plasma down-flow processing apparatus of the present invention comprises a temperature control means for setting the temperature in at least the essential portion of the silicon oxide region lower than that of the object to be processed in the hydrogen plasma down-flow processing apparatus for forming at least the principal portion of the structural members of a vacuum chamber to be exposed to the vacuum condition with silicon oxide, converting the gas including hydrogen to plasma and processing the object to be processed in the down-flow area of plasma.

In the present invention, the hydrogen plasma down-flow processing means the processing for the object mainly by neutral hydrogen atoms having the kinetic energy substantially equal to the thermal energy generated in the plasma under the condition that the hydrogen plasma generating region is isolated from the object processing region and the charged particles in the plasma and particles having a high kinetic energy are prevented from reaching the processing object. In general, if charged particles and particles having high kinetic energy have reached the processing object, these particles may probably give damages on the arrangement of atoms at the surface of the processing object or at the region near the surface thereof. However, a mixture of charged particles or particles having higher kinetic energy increases the reaction rate. Therefore, the hydrogen plasma down-flow processing of the present invention does not exclude every case of mixture of charged particles and particles having higher kinetic energy.

Referring to claims 1 and 2, at least the principal portion of the silicon oxide region is heated up to 400° C. or higher in view of preventing the hydrogen atoms to be adsorbed to the surface of silicon oxide so that recombination of hydrogen atoms is made difficult and transfer efficiency of hydrogen atoms to the processing chamber can be improved. If hydrogen atoms in the water vapor phase are flying toward the surface of silicon oxide, the probability of the hydrogen atoms to rebound into the water vapor phase without staying at the surface is substantially 1 at 443° C. or higher, according to the experiment by the inventors of the present invention, but it is enough for practical use when it is 400° C. or higher. In this case, the temperature, for example, 1200° C. or lower where the silicon oxide can thermally endure is enough as the upper limit temperature.

Referring to claims 3 and 2, at least the principal portion of the silicon oxide region is set to the temperature which is lower than that of the processing object (preferably, heater OFF condition) in view of improving the transfer efficiency of hydrogen atoms as already explained above. In this case, the temperature, for example, 0° C. or higher where $H_2O$ is not frozen is enough as the lower limit temperature. Moreover, when the temperature of the processing object is set to 150° C. or higher, even if the temperature of the silicon oxide region of the internal wall is boosted up to 80° C., it is enough for practical use because the surface is not easily inactivated due to $H_2O$ and OH radical and thereby the processing by hydrogen atoms can be done efficiently.

In the present invention, it is preferable that the silicon oxide is a silicon dioxide It should be noted that metal, carbon and organic substances are not appropriate because they absorb hydrogen atoms and moreover an organic substance reacts with oxygen to burn.

In the present invention, one preferred example of the processing object mentioned above could be a semiconductor. The semiconductor includes silicon (Si) and a compound semiconductor such as gallium-arsenide (GaAs).

In the present invention, it is desirable that the temperature of the processing object is higher than room temperature and is also lower than 443° C. Therefore, when the processing object is kept at the temperature as explained above before processing the object by hydrogen atoms, inactivation of the surface by $H_2O$ and OH radical can be efficiently realized and thereby processing by hydrogen atoms can be done very efficiently.

In the present invention, one preferred example of the processing object could be a semiconductor oxide. As the semiconductor oxide, a silicon oxide such as $SiO_2$ maybe used.

In the present invention, one preferred example of the gas explained above is composed of molecules including at least one oxygen atom. The molecules comprise $O_2$, $H_2O$, $H_2O_2$, $NO_2$, $N_2O$, $NH_3$, OH. Among these elements, $O_2$, $H_2O$, $NO_2$ are desirable in the stability and easiness of use and moreover $H_2O$ is most desirable for safety.

In the present invention, at least the principal portion of the internal wall of a vacuum chamber of the down-flow apparatus preferably is silicon oxide.

In the present invention, a method of heating the processing object can be implemented, for example, by placing the processing object tightly on a stage utilizing the gravity or a coulomb force and heating the processing object directly with infrared energy.

In view of attaining the object explained above, the hydrogen plasma down-flow processing method of the present invention can be implemented by introducing a new hydrogen gas into a portion of the vacuum chamber between the plasma discharging portion and the processing object.

In view of attaining the object explained above, the hydrogen plasma down-flow processing apparatus can be implemented by installing a hydrogen introducing means for introducing hydrogen gas into a portion of the vacuum chamber between the plasma discharging part and the processing object.

In the present invention, it is preferable to install a metal plate having an aperture hole having an internal diameter smaller than the wavelength of the plasma exciting frequency between the hydrogen introducing port and plasma discharging portion. In this case, since it is possible not to introduce the plasma in the down-flow side beyond the metal plate, hydrogen $H_2$ to be introduced between the metal plate and processing chamber can no longer be exposed to plasma. Here, the aperture hole installed on the metal plate is given the internal diameter shorter than the wavelength of the microwave because if the diameter is longer, the microwave power passes through the hole. The metal plate is made of aluminum. This aluminum plate is preferable for less contamination during semiconductor processing. In addition, it is preferable to install a metal plate so that a pressure difference is generated between the up-flow and down-flow sides. In this case, the discharging condition can be stabilized.

In view of attaining the object explained above, the hydrogen plasma down-flow processing method of the present invention can be implemented by controlling an adding ratio of water vapor and oxygen gas in the hydrogen plasma down-flow processing method where oxygen gas is used as the principal gas, a mixed gas obtained by adding at least water vapor and oxygen gas to the hydrogen gas is converted to plasma through electrolytic dissociation and the processing object is provided in the down-flow side of plasma for the processing.

The hydrogen plasma down-flow processing apparatus of the present invention can be implemented by a gas adding ratio controlling means for controlling an adding ratio of water vapor and oxygen gas to be added in the hydrogen plasma down-flow processing method where oxygen gas is used as the principal gas, a mixed gas obtained by adding water vapor and oxygen gas to the hydrogen gas is converted to plasma through electrolytic dissociation and the processing object is provided in the down-flow side of plasma for the processing.

In the present invention, it is preferable that a part of the internal wall of the vacuum chamber from at least the hydrogen introducing port to the processing object disposing area is silicon oxide.

First, operations of the present invention of the claims 1 and 2 will be explained hereunder.

The most significant cause of lower processing rate in the hydrogen radical processing is that the life time of hydrogen atoms is short and reactivity of hydrogen atoms is lost immediately due to recombination. The recombination of the hydrogen atoms is considered mostly to take place at a surface of an internal wall of the vacuum chamber. Particularly, in the case where the internal wall is a metal, hydrogen atoms penetrate into the metal and recombine with each other to form hydrogen molecules. Such hydrogen molecules are released again into the vacuum. Moreover, quartz which is often used as the material for the vacuum chamber reacts sometimes with hydrogen atoms and is thereby etched. In this case, hydrogen atoms are considered to form a compound with oxygen or silicon existing in quartz.

The present inventors made a variety of experiments in order to establish the condition that it is difficult for hydrogen atoms to recombine at the internal wall of the apparatus. As a result, as will be apparent from the embodiment explained later, hydrogen atoms can be transferred efficiently to the processing chamber by heating silicon oxide used in the apparatus up to 443° C. or higher. The estimated reason is that hydrogen atoms are not adsorbed by the silica surface heated up to 443° C. or higher and thereby recombination of hydrogen atoms are lowered at the quartz surface.

Operations of the invention described in the claims 3 and 4 will be explained hereunder.

It is the most distinctive reason, as explained previously, for lowering the processing rate of hydrogen radical processing that the life time of hydrogen atoms is rather short and reactivity thereof is lost immediately by recombination. However, in the system where small amounts of water vapor and oxygen are mixed to hydrogen for the discharging purpose utilizing a quartz chamber, a large amount of hydrogen atoms can be transferred up to the down-flow area, giving reality to the hydrogen radical processing. However, when water vapor is added, an oxidation agent such as water vapor itself, OH radicals, oxygen atoms (0 atoms) work to the surface, even if it only a small amount, and this oxidation agent interferes with the hydrogen atom processing because it ensures an intensive oxidation effect.

In general, hydrogen atoms generated by hydrogen plasma are reduced due to recombining with each other at the surface of the internal wall of the apparatus, which are composed of metal and quartz. Many metals have the property for catching hydrogen atoms therein and releasing hydrogen molecules and thereby remarkably lower hydrogen atom concentration. Moreover, a metal element itself is harmful and a contamination substance in many cases to semiconductors. Meanwhile, in general, silicon oxide such as quartz or the like is not as strong a contamination element to semiconductors and it is therefore often used for semiconductor manufacturing apparatus. However, since such silicon oxide itself is an oxide of semiconductor silicon, blocking of interaction between the quartz surface and hydrogen atoms in order to prevent reduction of hydrogen atoms is nothing but interference of the desirable reaction between the surface of silicon oxide as the processing object and hydrogen atoms.

Moreover, improvement in the transfer efficiency of hydrogen atoms due to the addition of water vapor and oxygen to the hydrogen plasma is considered to be a result from inactivation of quartz surface by $H_2O$ molecules or OH radicals.

Accordingly, the present inventors made a variety of experiments in order to realize reaction of hydrogen atoms with high efficiency at the surface of a processing object while maintaining the life prolongating effect for hydrogen atoms by water vapor. As a result, hydrogen atoms can be transferred with high efficiency to the processing chamber and it can be made difficult to inactivate the surface due to the processing $H_2O$ and OH radical in order to realize highly efficient hydrogen atom processing by setting, as will be indicated in the other embodiment of the present invention which will be explained later, the processing object to a temperature higher than that of the silicon oxide which is used in the apparatus.

Next, operation of the invention described in the claims 17 and 20 will be explained hereunder.

The inventors of the present invention made a variety of experiments in order to improve hydrogen plasma processing efficiency by reducing influence of oxidation species such as OH radicals. As a result, the number of OH radicals as the oxidation species generated by hydrogen added to the down-flow of plasma can be reduced without reducing the number of hydrogen atoms, like an embodiment explained later. The processing uses an apparatus having an extra inlet for hydrogen gas between the plasma discharging portion and the processing object. According to this method, the OH radical chemically reacts with the newly added hydrogen molecule ($H_2$ to produce $H_2O$ and H. Meanwhile, an oxygen atom (0) also reacts with a hydrogen molecule ($H_2$) to produce OH and H. The OH reacts again with another hydrogen molecule ($H_2$) to produce $H_2O$ and H. As a result, $H_2O$ and two hydrogen atoms are generated. Namely, the number of oxidation species can be reduced and the number of hydrogen atoms can be increased.

Next, operations of the invention described in the claims 27 and 28 will be explained.

The inventors of the present invention made a variety of experiments in order to control both concentration of oxygen atoms and OH radicals by controlling change of the hydrogen atom concentration. As a result, the optimum concentration of both oxygen atoms and OH radicals could have been selected holding down the change of the hydrogen atom concentration to a small amount by controlling a mixing ratio of water vapor and oxygen gas.

DESCRIPTION OF THE PREFERRED EMBODIMENTS

The present invention will be explained hereunder in detail with reference to the accompanying drawings.

Figure 1:
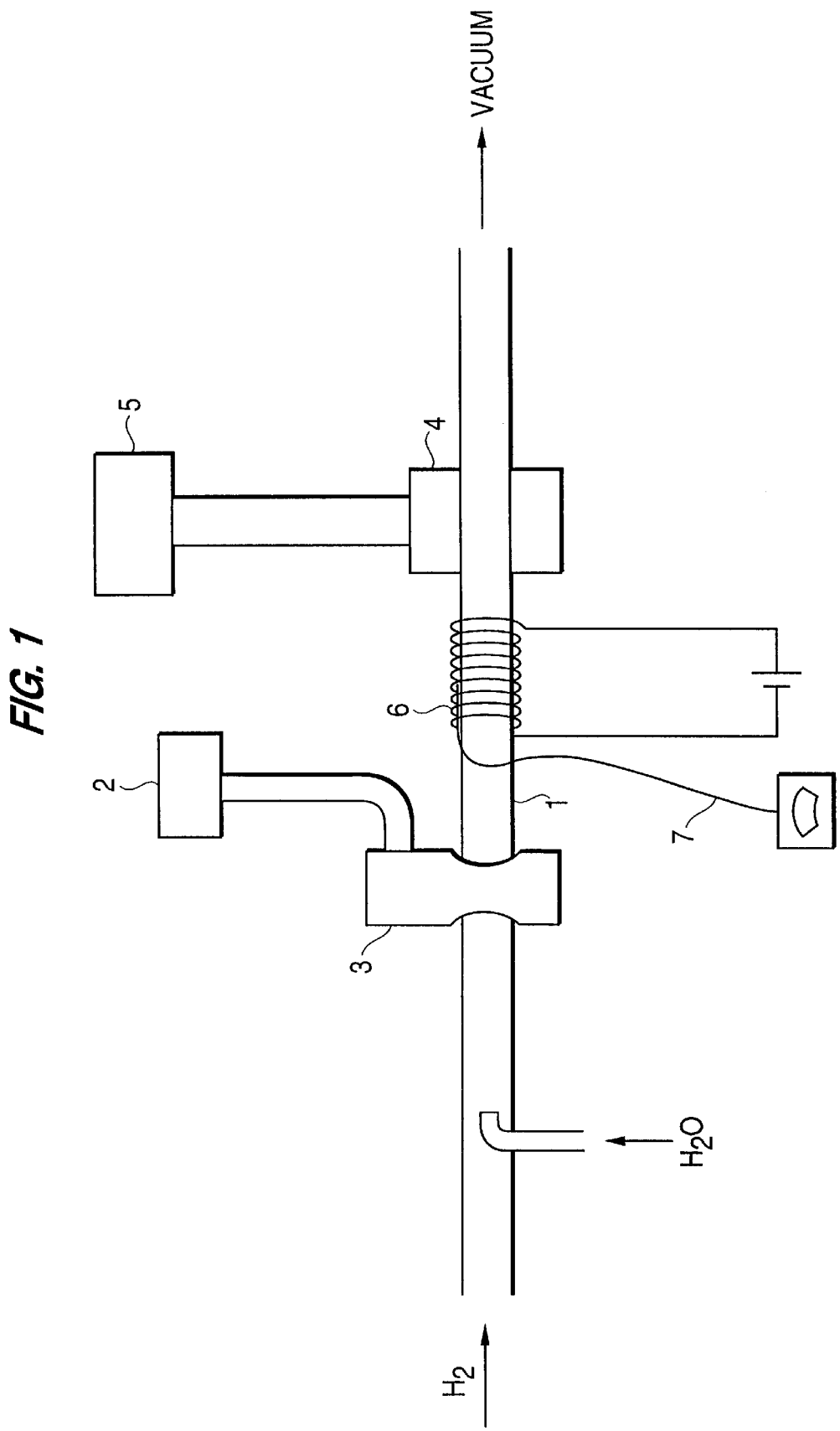
FIG. 1 is a diagram of a hydrogen plasma down-flow processing apparatus to study interaction between quartz and hydrogen for a first embodiment of the present invention.
Figure 2:
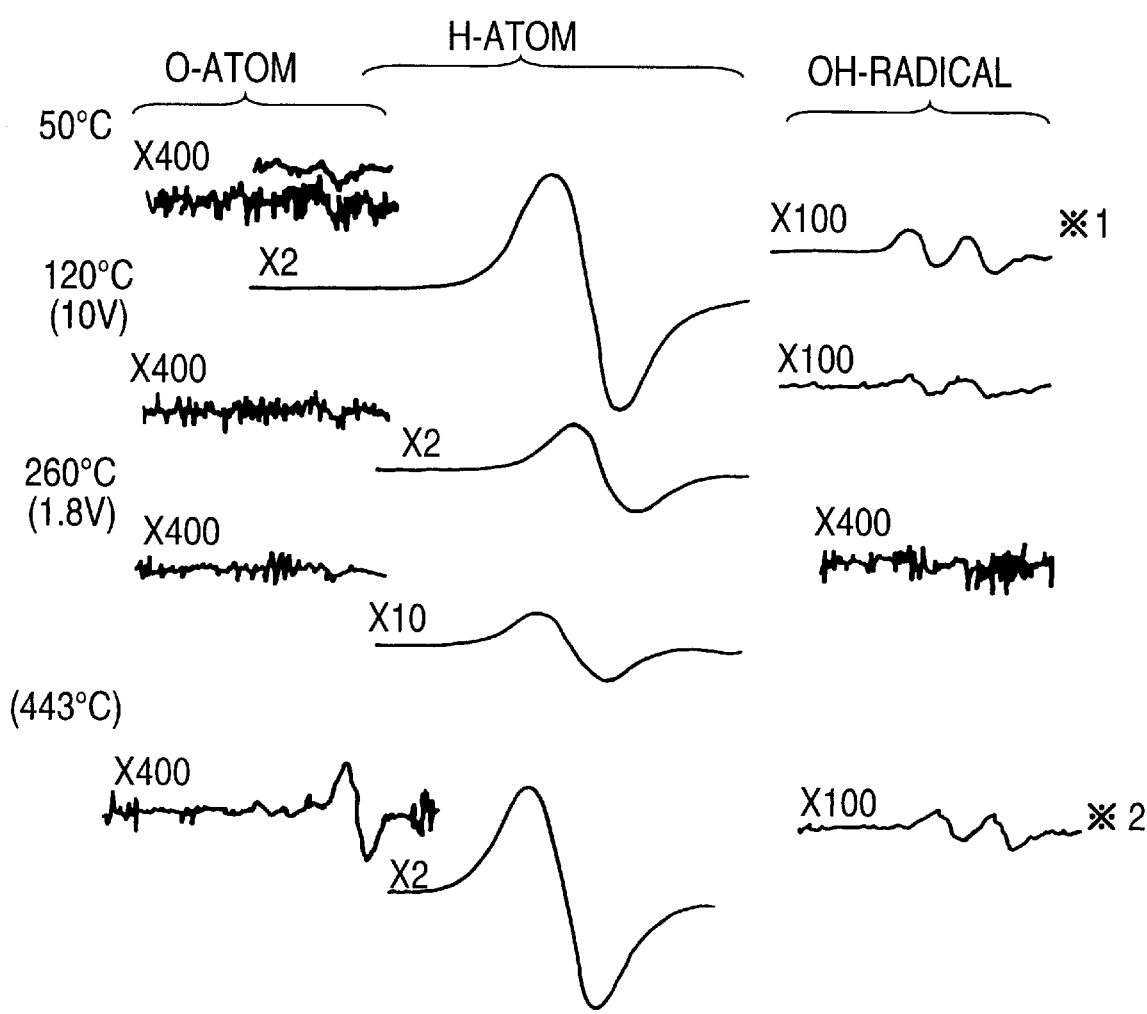
FIG. 2 is a diagram of ESR signals of hydrogen atom at various temperatures of a quartz tube for the first embodiment of the present invention.
Figure 3:
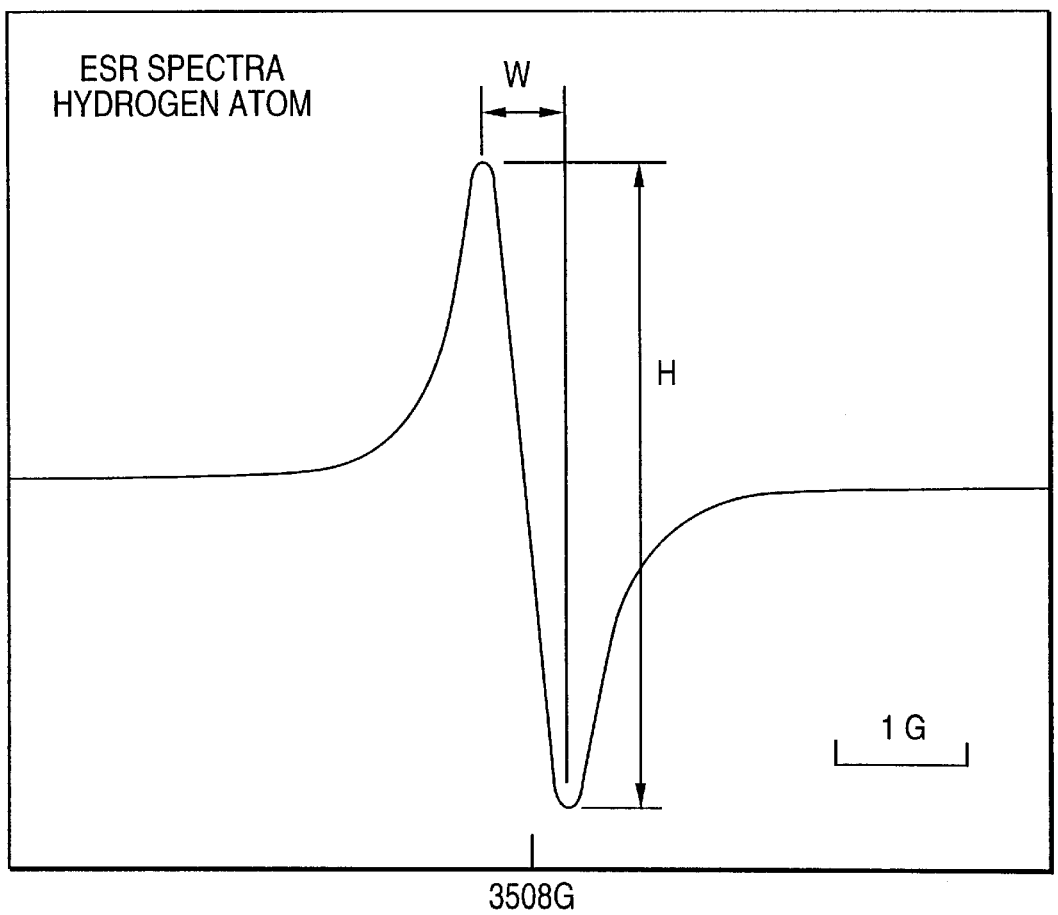
FIG. 3 is a diagram of a typical output signal of ESR for hydrogen atoms.
Figure 13:
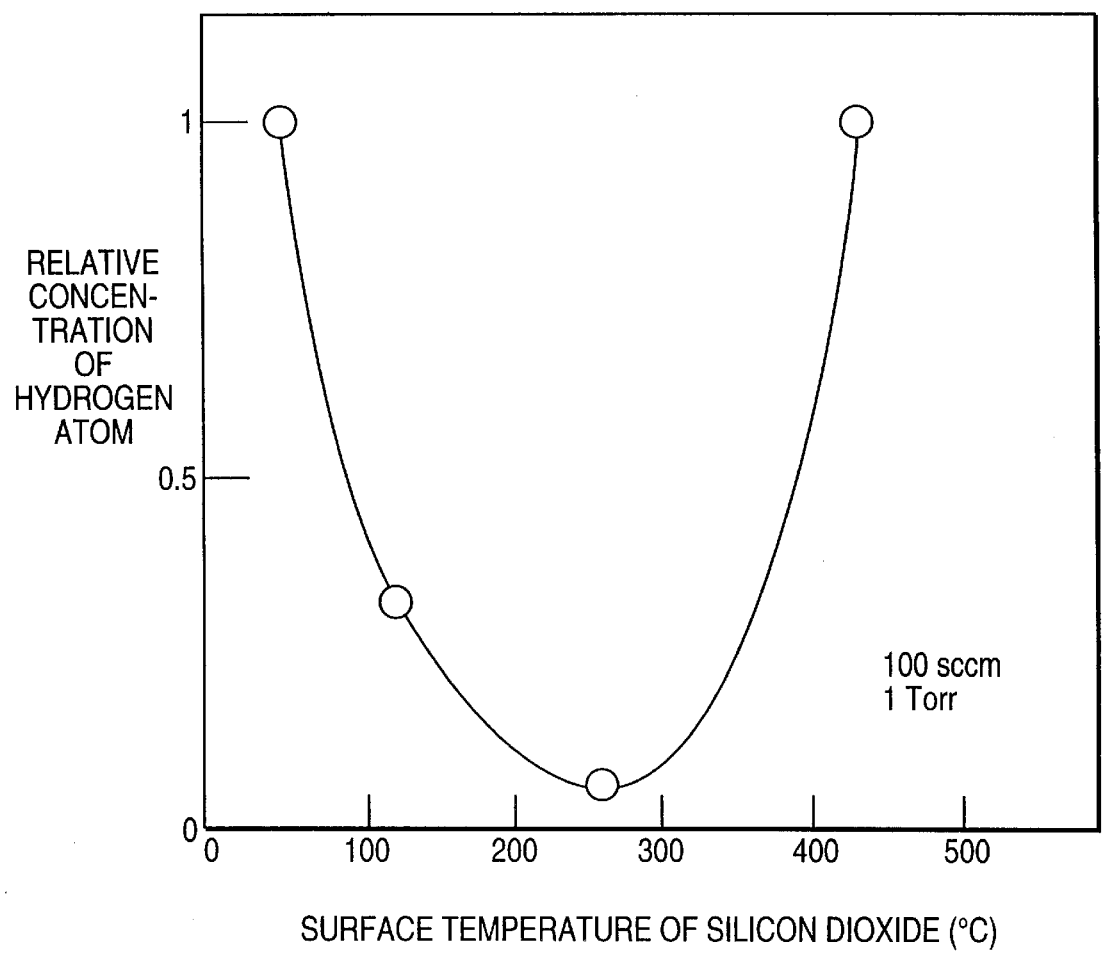
FIG. 13 is a diagram illustrating dependence of relative hydrogen atom concentration on the surface temperature of silicon dioxide

Related to the first embodiment of the present invention, FIG. 1 illustrates a structure of the apparatus for studying interaction between quartz and hydrogen. In FIG. 1, the numeral 1 designates a quartz tube with an internal diameter of 9 mm. Hydrogen and $H_2O$ were flowed at flow rates of 95 cc/min and 5 cc/min into this quartz tube 1, respectively, and the internal pressure of tube was adjusted to 1 Torr. Under this condition, plasma was generated in order to generate hydrogen atoms by microwaves of 2.45 GHz and 20 W within a microwave cavity 3 to which the microwaves were supplied from the microwave power supply 2. Concentration of hydrogen atoms in the down-flow area was measured by an ESR (electron spin resonance) apparatus installed in the down-flow area isolated by 300 mm from the plasma. The numeral 4 designates an ESR cavity connected to the ESR apparatus 5. Moreover, in view of changing the interaction between the internal wall of the quartz tube 1 and hydrogen atoms in the down-flow area, a heater coil 6 was installed in the range from 150 mm to 250 mm of the down-flow area apart from the plasma generation area for the purpose of heating the quartz tube 1. The temperature of the quartz tube 1 was measured by a thermocouple 7. Also, related to the first embodiment of the present invention, FIG. 2 shows ESR signals of a hydrogen atom when temperatures of the quartz tube 1 just under the heater 6 were set to 50° C. heater OFF, 120° C., 260° C. and 443° C., respectively. Hydrogen atoms are proportional to amplitude of signal (H of FIG. 3). FIG. 3 illustrates a typical example of ESR output signals for hydrogen atoms. Here, it is known that a value obtained by multiplying the square value of the width (W) between the maximum value and minimum value of this curve and a difference(H) of the height between the maximum value and minimum value is approximately proportional to hydrogen atom concentration. As is apparent from FIG. 2, hydrogen concentration is high under such a temperature as low as 50° C. (heater OFF). However, hydrogen concentration becomes lower as the temperature of the quartz tube 1 becomes as high as 120° C. and 260° C., indicating that hydrogen atom concentration is lowered due to the interaction at the surface of the quartz. That is, it can be understood that when heated, the inactivation effect for hydrogen atoms at the surface of the silicon oxide resulting from $H_2O$ or OH radical is lost and the interaction starts again between the surface of the silicon oxide and the hydrogen atoms. Moreover, when a temperature of the heater 6 was raised to 443° C., hydrogen atom concentration measured by ESR was rather raised in comparison with the case where the temperature was 260° C. It is because the hydrogen atoms are not adsorbed by the surface of silicon oxide when the temperature was 443° C. or higher. Thereby it can be confirmed that hydrogen atom concentration in the temperature range from 50 to 260° C. is lowered due to the interaction with the surface of quartz. In FIG. 13, hydrogen atom concentration of the above four cases is plotted with respect to the temperature of the quartz tube normalizing the concentration by the value at the temperature of 50° C. From this graph, it can be understood that (1) since a reaction progresses most efficiently at the wafer temperature near 260° C., the optimum temperature range of the wafer is 150° C. to 350° C. for the practical use and the temperature range from the room temperature to 443° C. in principle may also be acceptable in the case where the processing object having the silicon oxide or silicon surface is processed by hydrogen atoms under the condition that the effect of the quartz tube wall can be ignored. (2) When considering the effect of the quartz tube wall, the condition for realizing highly efficient processing is that hydrogen atom concentration at the surface of quartz tube is always kept higher than hydrogen atom concentration at the Si wafer surface.

From the above result, it can also be understood that the hydrogen atom processing can take place by raising temperature of the processing object without inactivation of the surface due to $H_2O$ or OH radicals. When the processing object would be a compound semiconductor like a gallium-arsenic semiconductor, decline of the reaction at 400° C. or higher could not be seen unlike a silicon oxide.

Moreover, since inactivation at the surface of silicon oxide occurs by $H_2O$ or OH radicals, the gas to be added to the hydrogen plasma always generates $H_2O$ or OH radicals due to the reaction in the plasma when it includes oxygen. Particularly, gases like $O_2$, $H_2O$, $H_2O_2$, $NO_2$, $NH_3OH$, and the like are composed of oxygen, hydrogen and nitrogen and bring lesser interference such as contamination, etching or deposition of substances in comparison with the case including other elements. $O_2$, $H_2O$, and $NO_2$ are especially easy to use for the safe property thereof.

Figure 4:
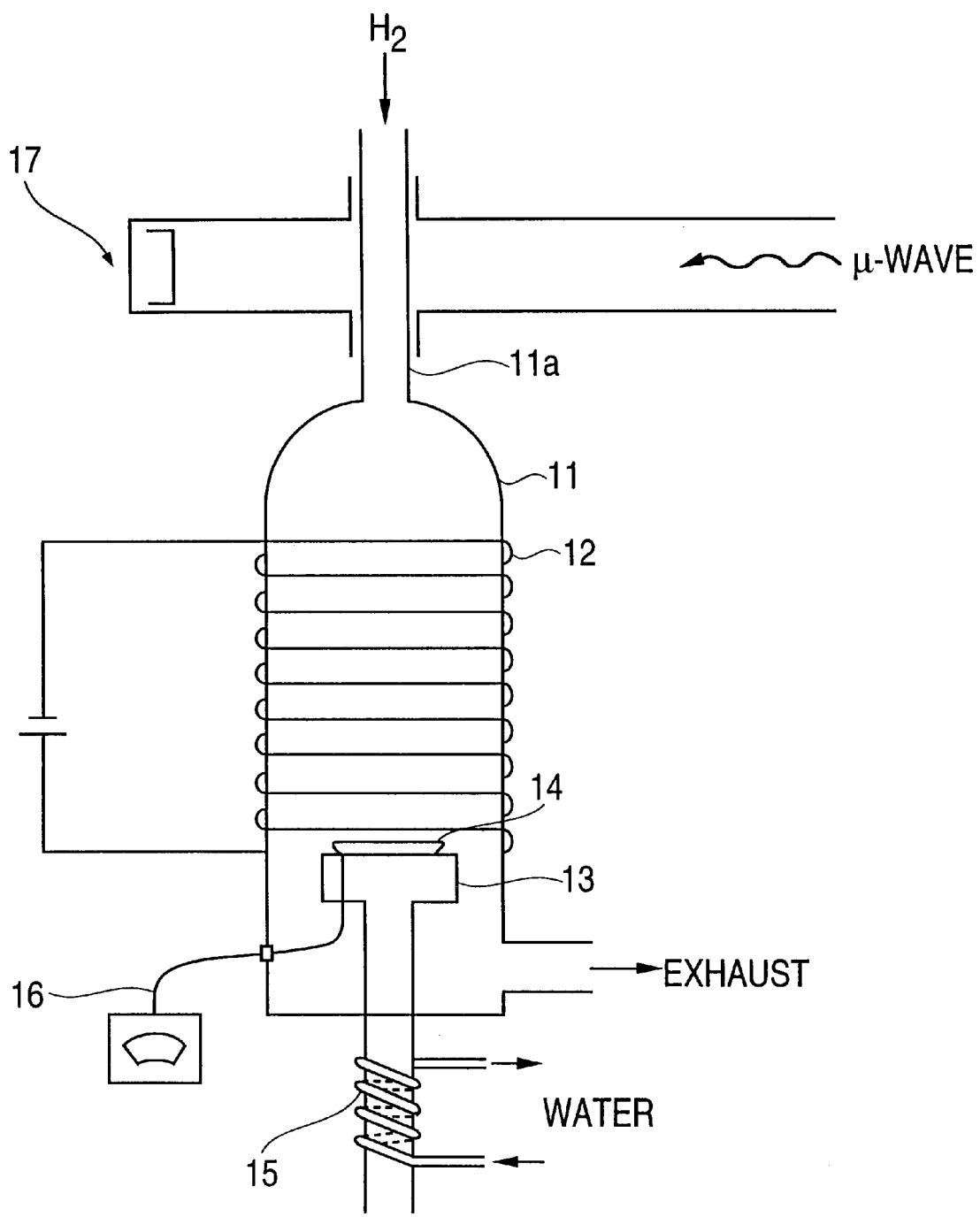
FIG. 4 is a diagram of a hydrogen plasma down-flow processing apparatus for a second embodiment of the present invention.

FIG. 4 illustrates a structure of a hydrogen plasma down-flow processing apparatus for a single wafer related to the second embodiment of the present invention processing. In FIG. 4, the numeral 11 designates a quartz chamber having a cylindrical shape and this quartz chamber 11 can be heated up to 600° C. by a heater 12. In this case, a wafer stage 13 was made of stainless steel and was kept at the temperature of about 250° C. by the water cooling process. Hydrogen gas was flowed at a flow rate of 500 cc/min and plasma was generated by the microwaves of 2.45 GHz and 1.5 kW. When the quartz chamber 11 was not heated, the native oxide film on the silicon wafer 14 was not removed even after processing for 60 minutes. But, when the quartz chamber 11 was heated at a temperature of 200° C., the native oxide film was removed for only 60 minutes. Existence of a native oxide film was confirmed by checking whether a wafer has hydrophilicity or hydrophobicity. In FIG. 4, the numerals 15, 16, and 17 designate a water cooling pipe, a thermocouple and a plunger, respectively.

Figure 5:
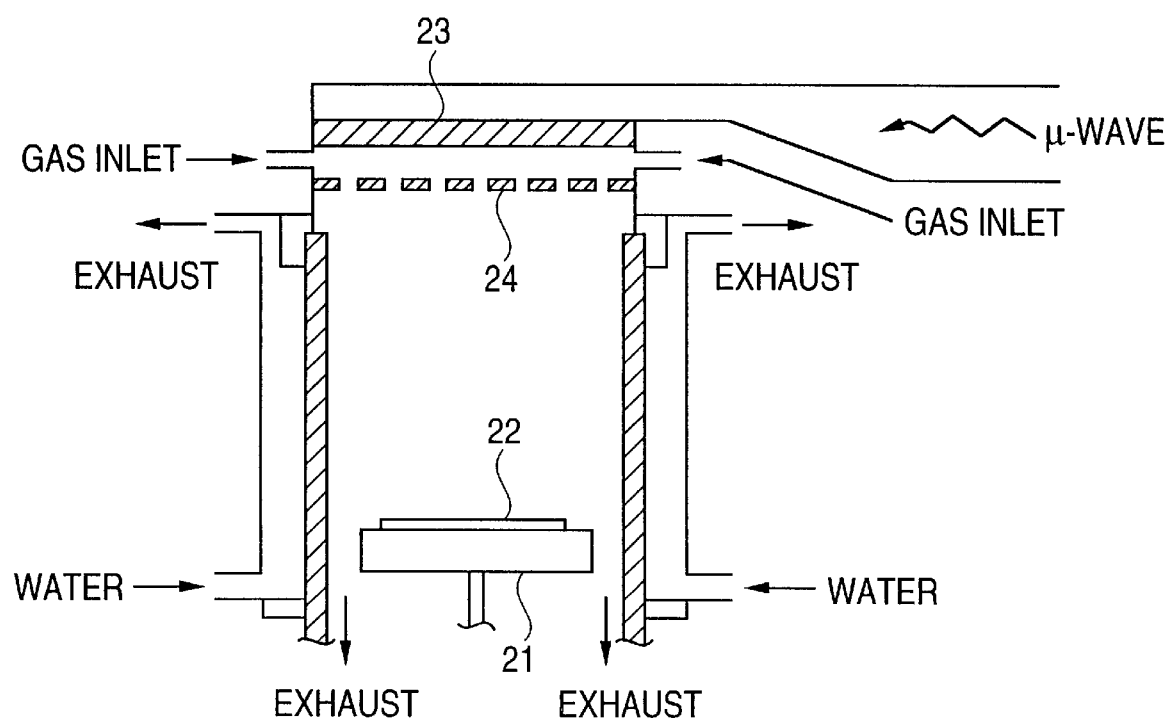
FIG. 5 is a diagram of a hydrogen plasma down-flow processing apparatus for a third embodiment of the present invention.

FIG. 5 illustrates a structure of a hydrogen plasma down-flow processing apparatus for single wafer processing, related to the third embodiment for the present invention. In FIG. 5, the numeral 21 designates a wafer stage which can be heated up to about 200° C. by an aluminum casting heater comprised therein. An internal wall of a cylindrical vacuum chamber made of quartz can be cooled by water. Here, a mixed gas of hydrogen of 475 cc/min and $H_2O$ of 25 cc/min was flowed and plasma was generated by the microwave signal of 2.45 GHz and 1.5 kW. When the wafer 22 was not heated, the native oxide film of the silicon wafer 22 could not be removed even after processing for 60 minutes, but when the wafer was heated up to 200° C., such a native oxide film was removed by the same processing for 60 minutes. Existence of a native oxide film was confirmed by checking whether the wafer has hydrophilicity or hydrophobicity. In FIG. 5, the numerals 23 and 24 designate a microwave transparent window and a shower head, respectively.

Figure 6:
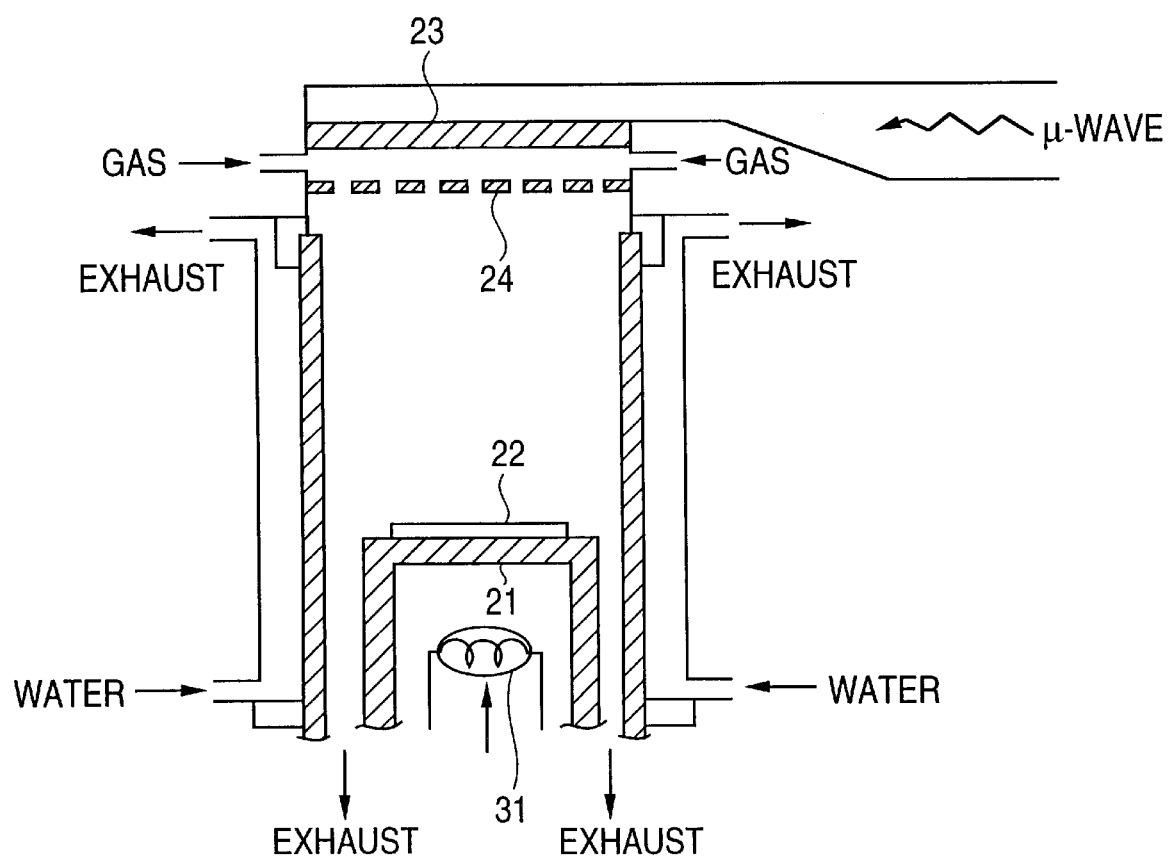
FIG. 6 is a diagram of a hydrogen plasma down-flow processing apparatus for a fourth embodiment of the present invention.

FIG. 6 illustrates a structure of a hydrogen plasma down-flow processing apparatus which realizes heating of wafers by an infrared lamp related to the fourth embodiment of the present invention. In FIG. 6, the same numerals as those in FIG. 5 designate the same elements as those in FIG. 5. The numeral 31 designates an infrared lamp for heating a wafer 22. An internal wall of a cylindrical vacuum chamber is made of quartz. The wafer 22 was heated up to 350° C. and the other conditions were the same as those in FIG. 5 for the necessary processings. In this case, the wafer 22 processed only for 20 minutes indicated the water repellent property.

Figure 7:
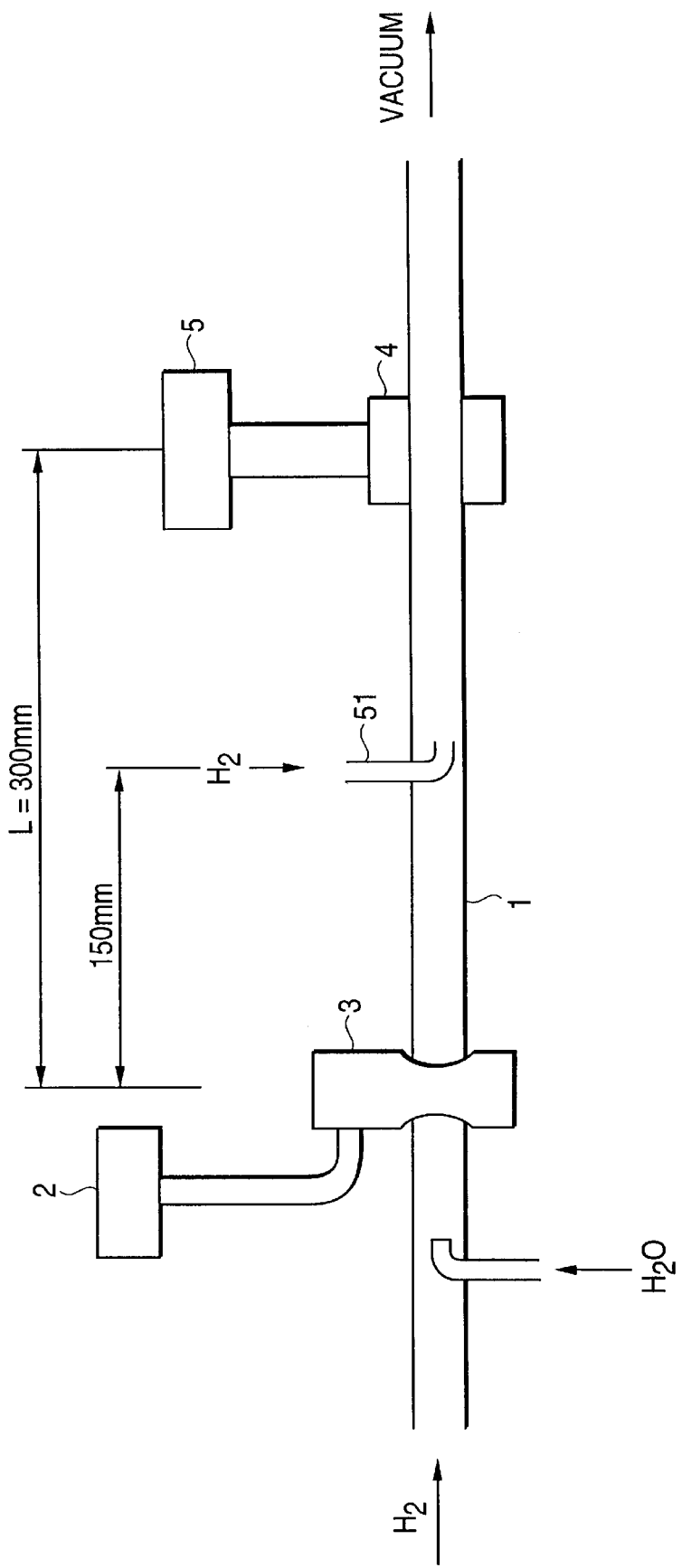
FIG. 7 is a diagram of a hydrogen plasma down-flow processing apparatus for a fifth embodiment of the present invention.

FIG. 7 illustrates a structure of a hydrogen plasma down-flow processing apparatus comprising a hydrogen gas introducing means to newly introduce a hydrogen gas between the plasma discharging portion and the processing object related to the fifth embodiment for the present invention. In FIG. 7, the same numerals as those in FIG. 1 designate the same elements as those in FIG. 1. The numeral 51 designates a hydrogen $H_2$ introducing port for introducing $H_2$ into the quartz tube 1 installed between the microwave cavity 3 and ESR cavity 4.

A mixed gas of $H_2$ (95%) and $H_2O$ (5%) was flowed into the apparatus of FIG. 7 at the flow rate of 100 cc/min and the internal pressure of the quartz tube 1 was set to 1 Torr. Thereafter, plasma was generated by microwaves of 2.45 GHz and 20 W. Moreover, the $H_2$ gas was introduced at the flow rate of 40 cc/min from the hydrogen gas introducing port 51 installed in the down-flow area, separated by 15 cm from the microwave cavity 3. When the hydrogen gas was added, the pressure during the discharging was increased by about 10 to 20% and the hydrogen atom concentration in the process measured by the actinometry method was reduced by about 5%. The effect of hydrogen gas added in the down-flow area was confirmed by measuring concentration of unpaired hydrogen electrons and OH radicals by the ESR (electron spin resonance) apparatus 5 installed in the down-flow area isolated by 30 cm from the process discharge cavity.

Figure 8:
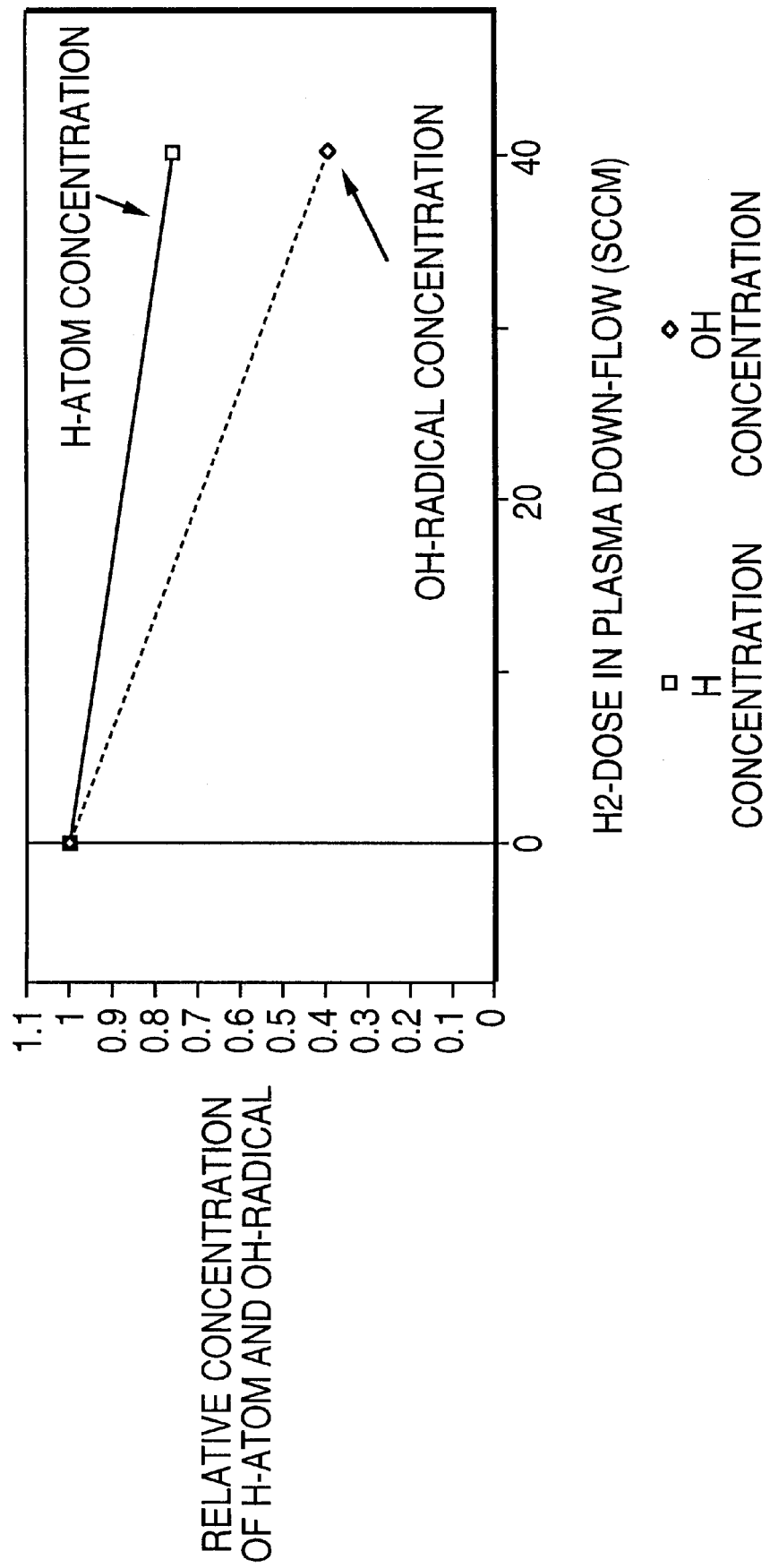
FIG. 8 is a diagram of changes of concentration of hydrogen atom and OH radical with respect to hydrogen gas flow rate for the fifth embodiment of the present invention.

FIG. 8 illustrates a change of concentration of hydrogen atoms and OH radicals measured when hydrogen gas was newly added in the apparatus of FIG. 7. In the ESR apparatus, the signal outputted as shown in FIG. 3 as explained above has the waveform of a differentiated signal, appearing as a pair of the one upward peak and the one downward peak and here it is also known that height between the peaks is proportional to the number of particles. As will be understood from FIG. 8, concentration of the hydrogen atoms does not change so much as 20% even after hydrogen is newly added in the down-flow area, while concentration of OH radicals is already reduced as much as 60%. Therefore, it can be seen that concentration of the OH radical as an oxidation species can be attenuated by adding hydrogen gas in the down-flow area, without H atoms.

Figure 9:
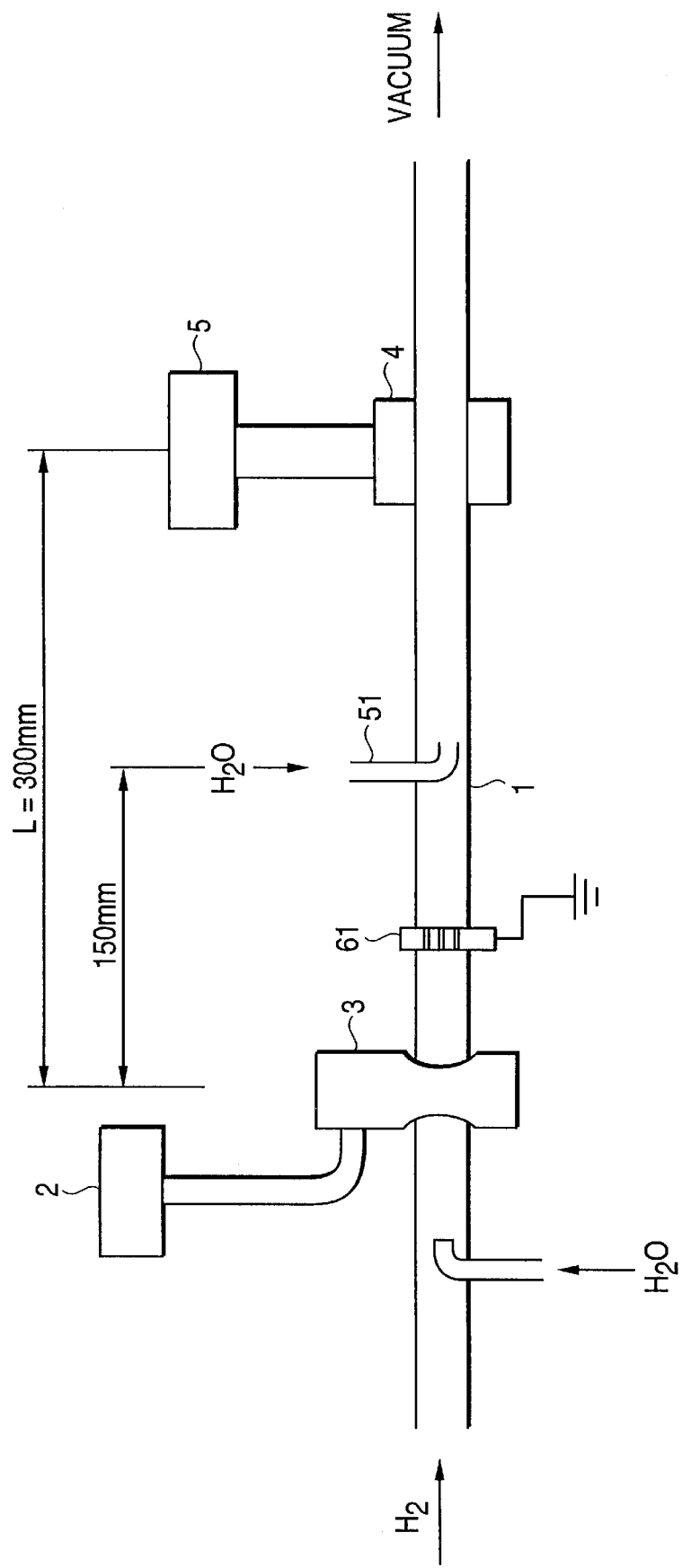
FIG. 9 is a diagram of a hydrogen plasma down-flow processing apparatus for a sixth embodiment of the present invention.

Related to the sixth embodiment for the present invention, FIG. 9 illustrates a structure of a hydrogen plasma down-flow processing apparatus wherein the aluminum shower heads having an internal diameter of 1 mm and a plate thickness of 5 mm are installed at an interval of 3 mm between the hydrogen introducing port installed in the down-flow area and plasma discharging portion. In FIG. 9, the same numerals as those in FIG. 7 designate the same elements as those in FIG. 7. The numeral 61 designates aluminum shower heads which are electrically grounded. The shower heads 61 can suppress leaks of the high frequency element exciting the plasma into the down-flow area and also can prevent spread of plasma into the hydrogen introducing port 51. Moreover, in this case, since gas conductance of shower heads 61 is smaller than that of the quartz tube, a pressure difference is generated between the up-flow and down-flow areas. Thereby, when hydrogen is added in the further down-flow area the plasma generation can be easily avoided. Moreover, when the apparatus of FIG. 9 was used, the OH removing effect was almost equal to that by the apparatus shown in FIG. 7. However, the effect on the plasma that hydrogen is added to the down-flow is rather small and the number of hydrogen atoms in the plasma measured by the actinometry method does not change significantly.

Figure 10:
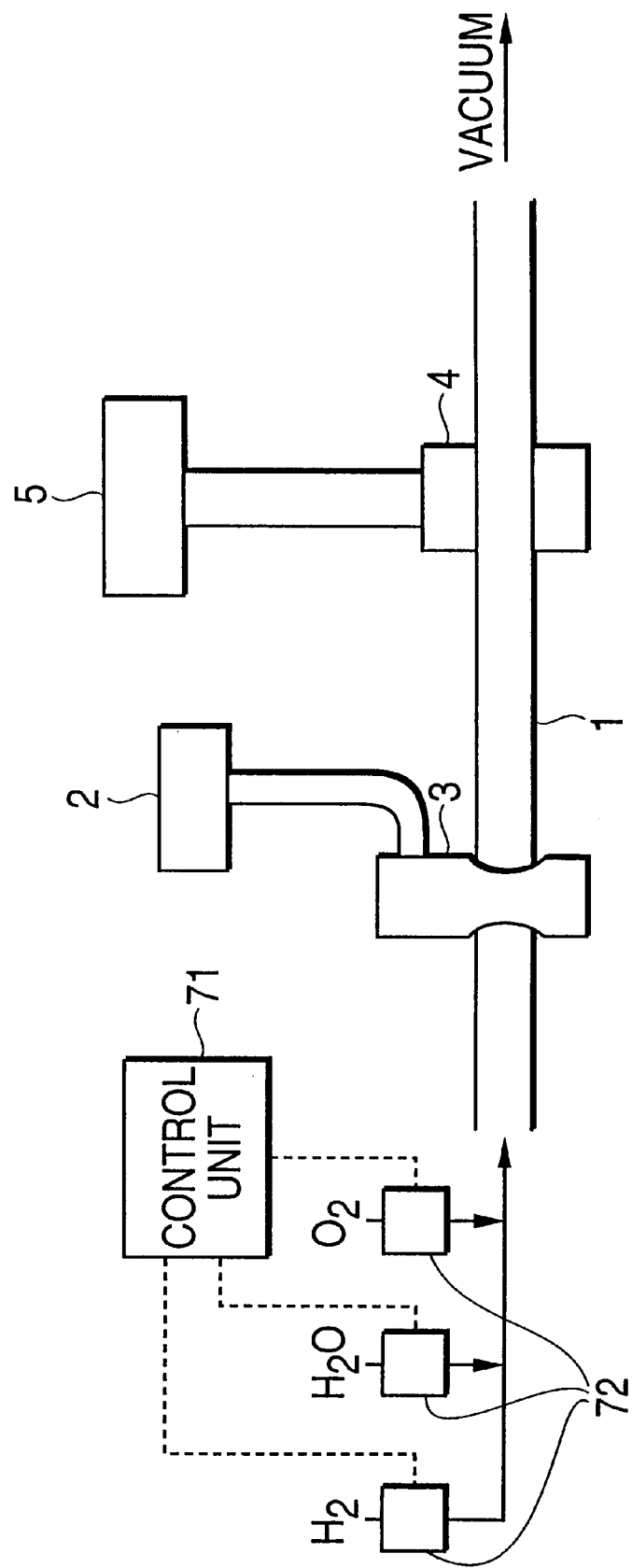
FIG. 10 is a diagram of a hydrogen plasma down-flow processing apparatus for a seventh embodiment of the present invention.

Related to the sixth embodiment of the present invention FIG. 10 illustrates a structure of a hydrogen plasma down-flow processing apparatus having an adding ratio control means for controlling an adding ratio of water vapor and oxygen gas to be added. In FIG. 10, the same numerals as those in FIG. 1 designate the same elements as those in FIG. 1. The numeral 1 designates a quartz tube as in the case of FIG. 1 and hydrogen gas, oxygen gas and water vapor are flowed from the up-flow area. In this case, $H_2$ gas, $H_2O$ vapor and $O_2$ gas are introduced properly by the adding ratio control apparatus 71. The numeral 72 designates a gas flow meter to measure the flow rate of each gas or water vapor. In the down-flow area, a vacuum pump (not illustrated) is connected. The numeral 3 designates a microwave cavity which is connected to four microwave power supplies (2.45 GHz) to obtain plasma through discharge. The numeral 5 designates an ESR (Electron Spin Resonance) apparatus. As explained above, a product of the square of the width (W) between the maximum value and minimum value of this curve and difference (H) of the heights of the maximum value and minimum value is approximately proportional to hydrogen atom concentration. Thereby, a relative concentration change of hydrogen atom concentration was calculated. Moreover, oxygen atom concentration and OH radical concentration were obtained through similar calculations.

Figure 11:
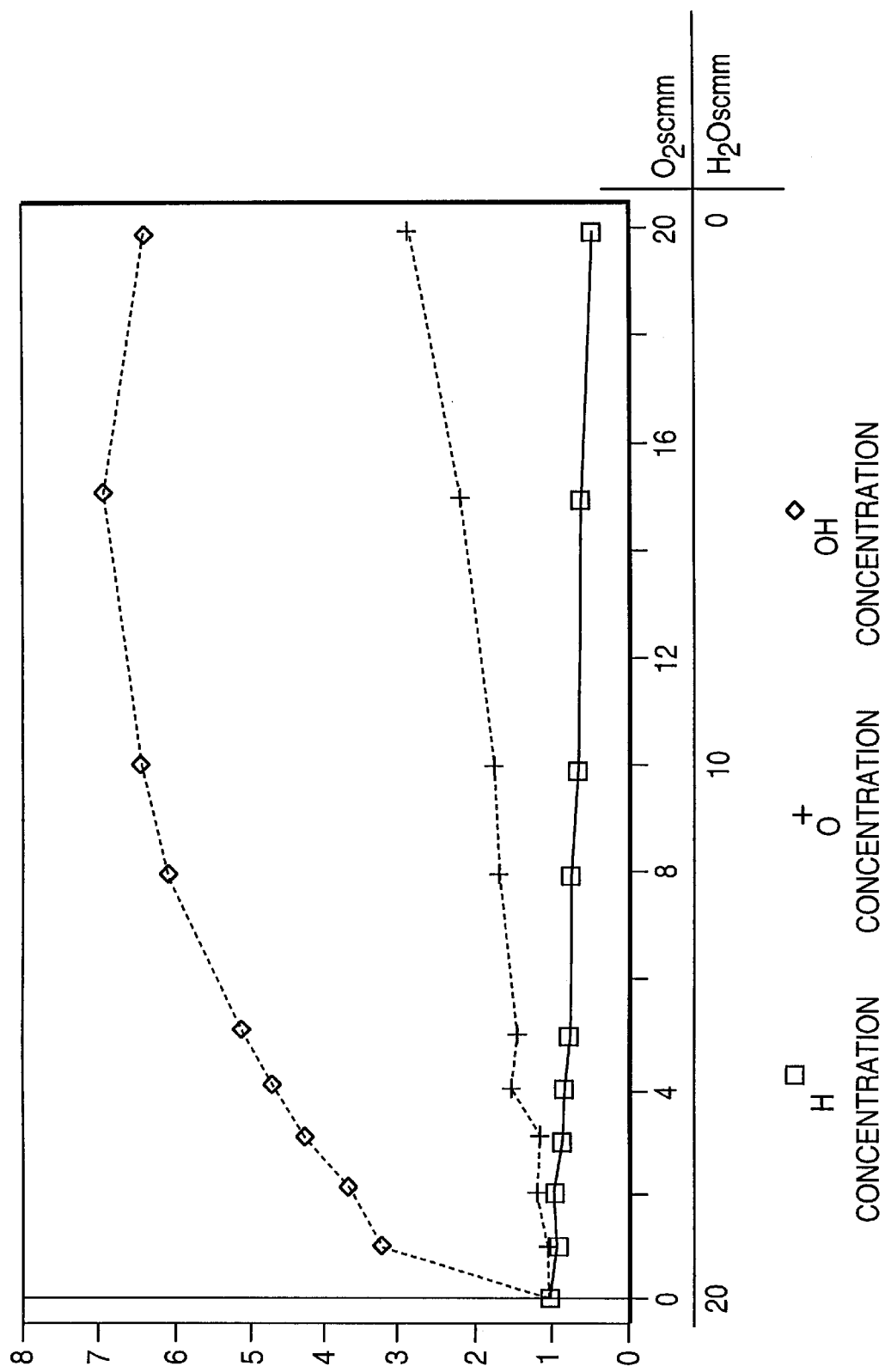
FIG. 11 is a diagram of changes of concentration of hydrogen atom, oxygen atom and OH radical with respect to a ratio of water vapor and oxygen for the seventh embodiment of the present invention.
Figure 12:
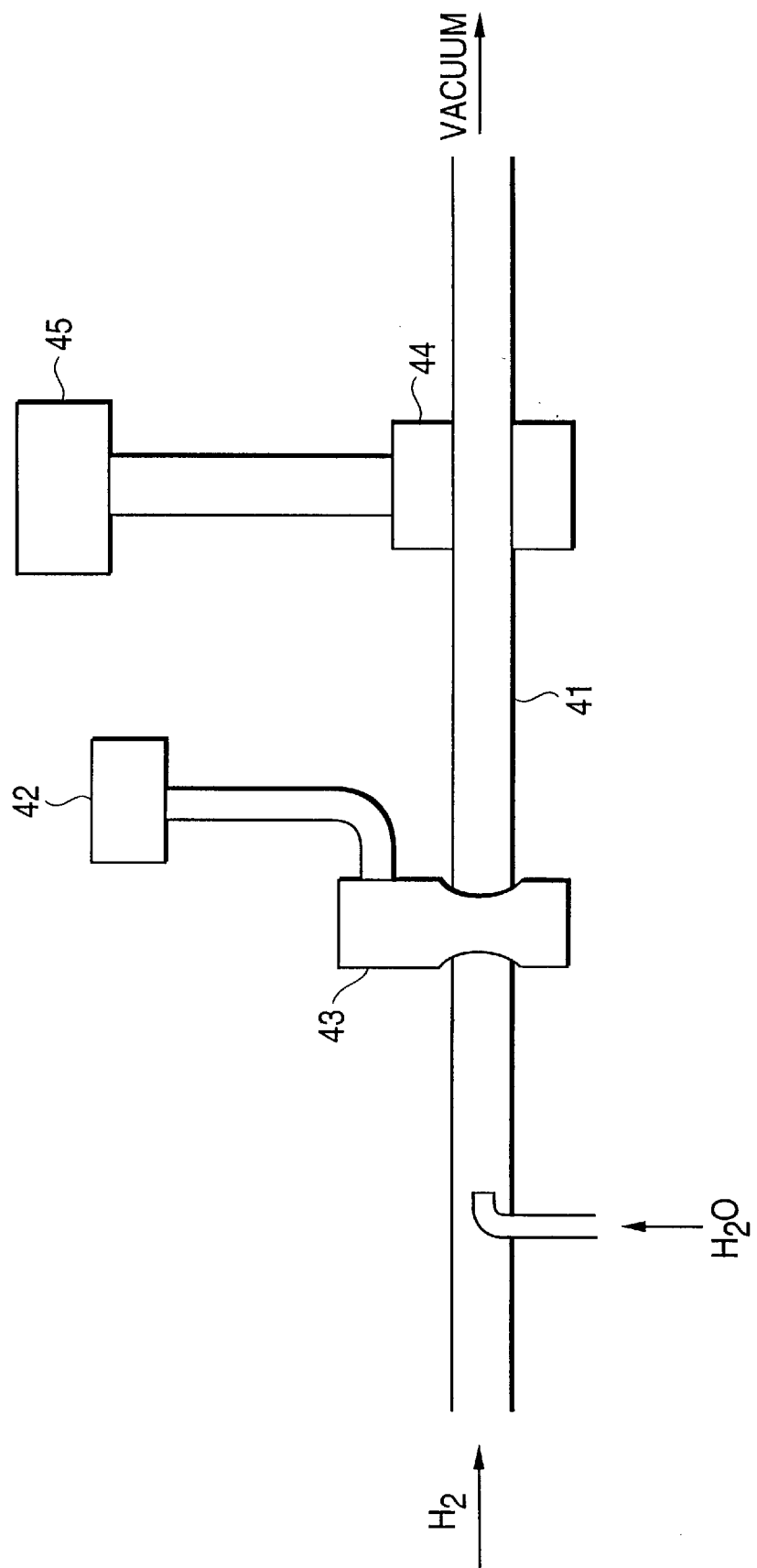
FIG. 12 is a diagram of a hydrogen plasma down-flow processing apparatus of the prior art.

FIG. 11 illustrates the relative concentration of hydrogen atoms, oxygen atoms, and OH radicals when oxygen gas and water vapor are added to hydrogen gas while adding ratios are changed. In this figure, the total flow rate of mixed gas is kept at 100 sccm, 1 Torr, while the hydrogen gas is kept constant at 80 sccm and a total flow rate of water vapor and oxygen gas is kept at 20 sccm with the mixing rate thereof changed. In this case, each concentration of hydrogen atom, oxygen atom and OH radical is normalized by the concentration when water vapor is 20 sccm. Referring to this FIG. 11, the concentration of OH radical can be changed in the range from 1 to about 7 times while the hydrogen atom concentration is kept almost constant when the adding ratio of the water vapor and oxygen gas ($H_2O: O_2$) is changed in the range from 100:0 (20 sccm:0 sccm) to 85:15 (17 sccm:2 sccm). In addition, when the hydrogen atom concentration may be reduced to ½, the OH radical concentration can be changed in the range from 1 to about 8 times, while oxygen atom concentration in the range from 1 to 2 times when the adding ratio of water vapor and oxygen gas ($H_2O:O_2$) is changed in the range from 100:0 (20 sccm 0 sccm) to 0:100 (0 sccm:20 sccm).

According to the present invention, the following useful results can be obtained: it is possible to make it difficult for hydrogen atoms to recombine at the internal wall of the apparatus, high speed hydrogen plasma processing can be ensured by improving transfer efficiency of hydrogen atoms to the processing chamber, and moreover, concentration of oxygen atoms and OH radicals can be controlled as desired by keeping the change of hydrogen atom concentration small.

We claim:

1. A method for processing an object in a hydrogen plasma down-flow where substantially, neutral reactive species survive and ions are extinct, comprising the steps of:

using an apparatus having a vacuum chamber wherein a substantial part of an inside wall exposed to a vacuum is silicon oxide;

generating a hydrogen plasma in a gas comprising hydrogen;

processing an object at down-flow area of the hydrogen plasma in the vacuum chamber; and controlling a temperature of a substantial part of the silicon oxide.

2. The method, according to claim 1, wherein the substantial part of the silicon oxide has a temperature equal to or higher than 400° C.

3. A method for processing an object in a hydrogen plasma down-flow where substantially, neutral reactive species survive and ions are extinct, comprising the steps of:

using an apparatus having a vacuum chamber wherein a substantial part of an inside wall exposed to a vacuum is silicon oxide;

processing an object at down-flow area of a hydrogen plasma in the vacuum chamber; and keeping a substantial part of the silicon oxide at a temperature equal to or lower than that of the object.

4. The method, according to claim 3, wherein the substantial part of the silicon oxide has a temperature equal to or lower than 80° C.

5. An apparatus for processing an object having silicon oxide thereon in a plasma down-flow where substantially, neutral reactive species survive and ions are extinct, comprising:

a plasma generation chamber where a plasma is generated from a gas mixture containing hydrogen and water vapor by a microwave;

a gas supplier for supplying the gas mixture into the plasma generation chamber;

a processing chamber where the plasma down-flow is introduced from the plasma generation chamber, and the object is located, the processing chamber having an inside wall a substantial part of which is silicon oxide;

a shield being located between the plasma generation chamber and the processing chamber, the shield admitting the neutral reactive species into the processing chamber but shielding the microwave and the ions, and also generating a pressure difference between the plasma generation chamber and the processing chamber; and control means for controlling a transfer efficiency of hydrogen atoms to the object by reducing more OH radicals than hydrogen atoms in the plasma down-flow between the shield and the object.

6. An apparatus for processing an object in a plasma down-flow where substantially, neutral reactive species survive and ions are extinct, comprising:

a plasma generation chamber where a plasma is generated from a gas mixture containing hydrogen and water vapor by a microwave;

a gas supplier for supplying a gas mixture containing hydrogen and water vapor into the plasma generation chamber;

a processing chamber wherein the plasma down-flow is introduced from the plasma generation chamber, and the object is located, the processing chamber having an inside wall a substantial part of which is silicon oxide;

a shield being located between the plasma generation chamber and the processing chamber, the shield admitting the neutral reactive species into the processing chamber but shielding the microwave and the ions, and also generating a pressure difference between the plasma generation chamber and the processing chamber; and control means for maintaining the substantial part of the inside wall at such a first temperature that more OH radicals are reduced than hydrogen atoms and maintaining the object at such a second temperature that more hydrogen atoms than OH radicals react with the object.

7. The method, according to claim 1, wherein the silicon oxide is silicon dioxide.

8. The apparatus, according to claim 5, wherein the processing chamber is made of quartz.

9. The method, according to claim 1, wherein the object comprises at least a semiconductor.

10. The method, according to claim 1, wherein the object has a temperature between a room temperature and 443° C.

11. The apparatus, according to claim 6, wherein the first temperature is between 0° C. and 1200° C., while the second temperature is between 150° C. and 350° C. and that the first temperature is lower than the second temperature when the second temperature is equal to or lower than 260° C., or the first temperature is higher than the second temperature when the second temperature is equal to or higher than 260° C.

12. The method, according to claim 1, wherein the object comprises at least a semiconductor oxide.

13. The apparatus, according to claim 6, wherein the control means employs a combination of water cooling and electric heating.

14. The method, according to claim 1, wherein the gas comprises a gas composed of a molecule having at least an oxygen atom.

15. The apparatus, according to claim 6, wherein the gas mixture contains a gas composed of a molecular structure having at least an oxygen atom therein.

16. A method for processing an object in a plasma down-flow where substantially, neutral reactive species survive and ions are extinct, comprising the steps of:

supplying a gas mixture containing hydrogen and water vapor into a plasma generation chamber;

generating a plasma from the gas mixture in the plasma generation chamber by supplying a microwave;

admitting the neutral reactive species into a processing chamber but shielding the microwave and the ions by a shield which connects the plasma generation chamber to the processing chamber;

reducing relative concentration of OH radicals in the plasma down-flow by supplying an additional hydrogen gas into an up-flow area of the processing chamber, thereby to increase relative concentration of hydrogen atoms in a down-flow area of the processing chamber; and exposing an object to the plasma down-flow in the down-flow area of the processing chamber.

17. The method, according to claim 17, wherein the shield has a hole with an inner diameter shorter than a wave-length of the microwave for plasma generation.

18. An apparatus for processing an object having silicon oxide thereon in a plasma down-flow in which substantially neutral reactive species survive and ions are made extinct, comprising:

an inlet to introduce water vapor, an inlet to introduce oxygen, and an inlet to introduce hydrogen;

a plasma generation chamber for generating a plasma in a gas mixture containing the hydrogen and the water vapor by supplying microwaves into the gas mixture through a microwave transparent window;

a processing chamber for processing the object in the plasma down-flow, the processing chamber having an inside wall enclosing a transporting space through which plasma effluent is transported to a processing space where the object is processed;

a first shield disposed between the plasma generation chamber and the processing chamber for preventing the microwaves, ions and particles accelerated by the microwaves from going into the processing chamber, but admitting neutral reactive species into the processing chamber, the first shield having an aperture connecting the plasma generation chamber to the processing chamber; and an extra inlet for introducing additional hydrogen gas into the transporting space such that the additional hydrogen gas reacts on the inside wall to reduce OH radicals and oxygen atoms and thereby increase the number of free hydrogen atoms in the processing space.

19. The apparatus, according to claim 18, wherein the aperture hole has an inner diameter shorter than a wave-length of the microwave for plasma generation and wherein the processing chamber is made of quartz.

20. The apparatus, according to claim 18, wherein a substantial part of the inside wall, at least from behind the first shield where the extra inlet is disposed down to a location of the object, is exposed to a vacuum and has a silicon oxide surface.

21. The apparatus, according to claim 20, wherein the shield is aluminum and wherein the processing chamber is made of quartz.

22. The method, according to claim 16, further comprising the step of controlling a pressure in the plasma generation chamber so as to be higher than a pressure in the processing chamber.

23. The apparatus, according to claim 20, further comprising a second shield made of metal so as to give rise to a pressure difference between an upstream area and a downstream area along the plasma down-flow.

24. A method for processing an object in a plasma down-flow where substantially, neutral reactive species survive and ions are extinct, comprising the steps of:

generating a plasma in a gas mixture containing hydrogen gas, water vapor and oxygen gas;

processing an object in a down-flow area of the processing chamber; and controlling a ratio of the water vapor to the oxygen gas in the gas mixture so as to increase relative concentration of OH radicals without appreciable decrease of relative concentration of hydrogen atoms in the neutral reactive species.

25. An apparatus for processing a semiconductor wafer having silicon oxide thereon in a plasma down-flow in which substantially neutral reactive species survive and ions are made extinct, comprising:

an inlet to introduce oxygen gas, an inlet to introduce hydrogen gas, and an inlet to introduce water;

a plasma generator to generate a plasma in a gas mixture containing at least said water vapor and said oxygen gas;

a semiconductor wafer supporting part disposed at a down-flow area of a processing chamber and able to maintain the semiconductor wafer at such a temperature that more hydrogen atoms than OH radicals react with the silicon oxide; and a controlling member to control a ratio of a relative concentration of OH radicals to a relative concentration of hydrogen atoms in the plasma down-flow at a location of the object, said controlling member having said inlet to introduce hydrogen gas being disposed in an up-flow of said processing chamber.

26. The method, according to claim 24, further comprising the step of supplying an additional hydrogen gas into an up-flow area of the processing chamber.

27. The apparatus, according to claim 28, wherein the preventing means is a shield disposed between said plasma generation chamber and the processing chamber, with a substantial part of an inside wall, which is expose to a vacuum at least from a place where additional hydrogen gas is supplied into the processing chamber to the area where the object is proccessed, having a silicon oxide surface and being disposed behind the shield.

28. A method for processing an object having silicon oxide thereon in a plasma down-flow comprising the steps of:

generating a plasma from a gas mixture essentially consisting of hydrogen and water vapor in a plasma generation chamber by a microwave;

admitting neutral reactive species into the plasma down-flow but preventing the microwave, ions, and particles having a high kinetic energy accelerated by the microwave from going into the plasma down-flow by a metal shield which has an aperture hole an internal diameter of which is smaller than a wavelength of the microwave, and connecting the plasma generation chamber to a processing chamber;

selecting a temperature of an inside wall of the processing chamber in an up-flow area thereof so as to control a life of the hydrogen atom to be longer than lives of OH radicals and oxygen atoms on the inside wall in the up-flow area of the processing chamber;

selecting a temperature of the silicon oxide on the object in a down-flow area of the processing chamber so as to control a life of the hydrogen atom to be shorter on the silicon oxide in the down-flow area than the life of the hydrogen atom on the inside wall in the up-flow area of the processing chamber; and removing the silicon oxide on the object by chemical reaction with the hydrogen atom.

29. A method for processing an object having silicon oxide thereon in a plasma down flow in a processing chamber, to which a shield connects a plasma generation chamber where a plasma is generated, where substantially, neutral reactive species survive and ions are extinct, the method comprising the steps of:

introducing a gas mixture containing hydrogen into the plasma generation chamber to generate a plasma containing atomic hydrogen;

maintaining a pressure higher in the plasma generation chamber than in the processing chamber by the shield having an aperture hole so as to produce the plasma down flow into the processing chamber where neutral reactive species containing the atomic hydrogen survive and ions are extinct;

maintaining a surface temperature of an inside wall of the processing chamber lower than 100° C. or higher than 400° C. so as to prolongate a life of the atomic hydrogen; and controlling a surface temperature of the object between 150° C. and 350° C.

30. A method for processing an object having silicon dioxide thereon in a plasma down-flow where substantially, neutral reactive species containing hydrogen atoms survive and ions are extinct, comprising the steps of:

generating a plasma from a gas mixture essentially consisting of hydrogen and water vapor in a plasma generation chamber by a microwave;

admitting the neutral reactive species into a processing chamber, an inside wall of which is silicon oxide, and deionizing the ions through a grounded metal shield having an aperture hole, which connects the plasma generation chamber to the processing chamber;

inactivating a surface of the inside wall of the processing chamber by OH radicals and $H_2O$ against the hydrogen atoms by maintaining such a temperature that the probability of hydrogen atoms to be rebound to vapor phase without staying on the surface of silicon oxide is substantially unity so that the hydrogen atoms are transferred to a down-flow area as neutral reactive species; and etching the silicon dioxide on the object by employing a chemical reaction with the hydrogen atoms in the down-flow area of the processing chamber.

31. The method, according to claim 3, wherein the object has a temperature between a room temperature and 443° C.

32. The apparatus, according to claim 6, wherein the first temperature is lower than 100° C. or higher than 400° C., while the second temperature is between 150 and 350° C.

33. The apparatus according to claim 6, wherein the first temperature is between 80° celsius and 600° celsius and the second temperature is 260° celsius.

34. The method for processing an object according to claim 32, wherein the surface temperature of the object is controlled to be 260° celsius.

35. The apparatus, according to claim 6, wherein the second temperature is 260° celsius.

36. An apparatus according to claim 25, wherein the controlling member includes an inside wall of the processing chamber having a silicon oxide surface along which the neutral reactive species flow down to the object, the silicon oxide surface being maintained at such a temperature that more OH radicals than hydrogen atoms react thereon and an extra inlet to introduce additional hydrogen gas into the plasma down-flow at such a location of the processing chamber that the introduced hydrogen gas is sufficiently supplied to the inside wall of the processing chamber.

37. An apparatus according to claim 25, wherein the temperature is between 150° C. and 350° C.

38. An apparatus according to claim 36, wherein the temperature of the oxide surface wall is lower than a temperature of the semiconductor wafer when the temperature of the oxide surface wall is lower than 260° C., and the temperature of the oxide surface is higher than the temperature of the semiconductor wafer when the temperature of the oxide surface wall is higher than 260° C.

39. An apparatus according to claim 18, wherein the extra inlet for additional hydrogen gas is installed on the inside wall a distance above the hydrogen inlet, the distance being in the range of from 150 mm to 250 mm.

40. An apparatus according to claim 25, wherein said controlling member is capable of improving transfer efficiency to said processing chamber by reducing a relative concentration of oxidation species with a relatively small change of a relative concentration of hydrogen atoms therein.

* * * * *

UNITED STATES PATENT AND TRADEMARK OFFICE
CERTIFICATE OF CORRECTION

PATENT NO.   : 6,007,671
DATED        : December 28, 1999
INVENTOR(S)  : Shuzo Fujimura et al.

It is certified that error appears in the above-identified patent and that said Letters Patent is hereby corrected as shown below:

Column 13,
Line 49, delete "that".

Column 14,
Line 55, after "vacuum" insert -- , --.

Column 15,
Line 31, change "object" to -- semiconductor wafer --;
Line 37, change "28" to -- 25 --;
Line 40, change "expose" to -- exposed --;
Line 43, change "proccessed" to -- processed --.

Column 16,
Line 57, change "celsius" (two occurrences) to -- C --;
Line 58, change "celsius" to -- C --,
Line 60, change "32" to -- 29 --;
Line 61, change "celsius" to -- C --;
Line 63, change "celsius" to -- C --.

Signed and Sealed this

Thirteenth Day of November, 2001

Attest:

NICHOLAS P. GODICI
*Acting Director of the United States Patent and Trademark Office*

*Attesting Officer*